US011887641B2

(12) United States Patent
van der Straten et al.

(10) Patent No.: US 11,887,641 B2
(45) Date of Patent: Jan. 30, 2024

(54) SIMULTANEOUS ELECTRODES FOR MAGNETO-RESISTIVE RANDOM ACCESS MEMORY DEVICES

(71) Applicant: International Business Machines Corporation, Armonk, NY (US)

(72) Inventors: Oscar van der Straten, Guilderland Center, NY (US); Koichi Motoyama, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 17/806,594

(22) Filed: Jun. 13, 2022

(65) Prior Publication Data
US 2023/0402078 A1 Dec. 14, 2023

(51) Int. Cl.
*G11C 11/16* (2006.01)
*H10B 61/00* (2023.01)
*H10N 50/01* (2023.01)
*H10N 50/10* (2023.01)
*H10N 50/80* (2023.01)
*H10N 50/85* (2023.01)

(52) U.S. Cl.
CPC ............ *G11C 11/161* (2013.01); *H10B 61/00* (2023.02); *H10N 50/01* (2023.02); *H10N 50/10* (2023.02); *H10N 50/80* (2023.02); *H10N 50/85* (2023.02); *G11C 11/16* (2013.01)

(58) Field of Classification Search
CPC ....... G11C 11/02; G11C 11/16; G11C 11/161; G11C 11/15; G11C 2211/5615
See application file for complete search history.

(56) References Cited

U.S. PATENT DOCUMENTS

| | | | |
|---|---|---|---|
| 9,502,640 B1 | 11/2016 | Annunziata | |
| 9,559,294 B2 | 1/2017 | Hsu | |
| 10,535,814 B2 | 1/2020 | Chuang | |
| 10,756,138 B2 | 8/2020 | Lin | |
| 10,790,439 B2 | 9/2020 | Ku | |
| 10,964,887 B2 | 3/2021 | Yang | |
| 11,075,335 B2 | 7/2021 | Chuang | |
| 11,121,174 B2 | 9/2021 | Reznicek | |
| 2009/0209050 A1 | 8/2009 | Wang | |
| 2011/0049655 A1 | 3/2011 | Assefa | |

FOREIGN PATENT DOCUMENTS

CN 107623014 A 1/2018

*Primary Examiner* — Alfredo Bermudez Lozada
(74) *Attorney, Agent, or Firm* — Michael A. Petrocelli

(57) ABSTRACT

A memory device includes a magnetic tunnel junction (MTJ) pillar between a top electrode and a bottom electrode. An amorphous dielectric hardmask is in contact with a first portion of an uppermost surface of the MTJ pillar. A first portion of a metal layer is disposed on opposite sidewalls of the amorphous dielectric hardmask and in contact with a second portion of the uppermost surface of the MTJ pillar extending outwards from the amorphous dielectric hardmask for providing the top electrode. A dielectric underlayer is in contact with a first portion of a bottommost surface of the MTJ pillar, while a second portion of the metal layer is disposed on opposite sidewalls of the dielectric underlayer. The second portion of the metal layer is in contact with a second portion of the bottommost surface of the MTJ pillar extending outwards from the dielectric underlayer for providing the bottom electrode.

20 Claims, 13 Drawing Sheets

SIMULTANEOUS ELECTRODES FOR MAGNETO-RESISTIVE RANDOM ACCESS MEMORY DEVICES

BACKGROUND

The present invention generally relates to the field of magnetic storage devices, and more particularly to high performance magneto-resistive random access memory devices.

Magneto-resistive random access memory (MRAM) is a non-volatile random access memory technology in which data is stored by magnetic storage elements. These magnetic storage elements are typically formed from two ferromagnetic plates, each of which can hold a magnetization, separated by a thin dielectric layer, i.e., the tunnel barrier. One of the two plates is a permanent magnet set to a particular polarity; the other plate's magnetization can be changed to match that of an external field to store memory. Such configuration is known as a magnetic tunnel junction (MTJ) pillar.

For high performance MRAM devices based on perpendicular MTJ pillars, well-defined interfaces and interface control are essential. Embedded MTJ pillar structures are usually formed by patterning of blanket MTJ stacks. Reactive-ion etch (RIE), and ion-beam etch (IBE) processing of such MTJ stacks presents a major challenge, as it typically leads to electrical shorts due to re-sputtering of underlying thick bottom metal layers onto MTJ stack sidewalls. Therefore, there is a need for improved designs and techniques that can prevent the deposition of re-sputtered conductive metal particles from underlying (thick) bottom metal layers on sidewalls of the MTJ stack.

SUMMARY

According to an embodiment of the present disclosure, a memory device includes a magnetic tunnel junction pillar surrounded by sidewall spacers, the magnetic tunnel junction pillar being located between a top electrode and a bottom electrode, an amorphous dielectric hardmask being in contact with a first portion of an uppermost surface of the magnetic tunnel junction pillar, a first portion of a metal layer on opposite sidewalls of the amorphous dielectric hardmask, the first portion of the metal layer being in contact with a second portion of the uppermost surface of the magnetic tunnel junction pillar extending outwards from the amorphous dielectric hardmask and in contact with an uppermost surface of the sidewall spacers, the first portion of the metal layer providing the top electrode, a dielectric underlayer being in contact with a first portion of a bottommost surface of the magnetic tunnel junction pillar, and a second portion of the metal layer disposed on opposite sidewalls of the dielectric underlayer, the second portion of the metal layer being in contact with a second portion of the bottommost surface of the magnetic tunnel junction pillar extending outwards from the dielectric underlayer and in contact with a bottommost surface of the sidewall spacers, the second portion of the metal layer providing the bottom electrode.

According to another embodiment of the present disclosure, a method of forming a memory device includes forming a magnetic tunnel junction pillar surrounded by sidewall spacers, the magnetic tunnel junction pillar being located between a top electrode and a bottom electrode, forming an amorphous dielectric hardmask in contact with a first portion of an uppermost surface of the magnetic tunnel junction pillar, forming a first portion of a metal layer on opposite sidewalls of the amorphous dielectric hardmask, the first portion of the metal layer being in contact with a second portion of the uppermost surface of the magnetic tunnel junction pillar extending outwards from the amorphous dielectric hardmask and in contact with an uppermost surface of the sidewall spacers, the first portion of the metal layer providing the top electrode, forming a dielectric underlayer in contact with a first portion of a bottommost surface of the magnetic tunnel junction pillar, and forming a second portion of the metal layer on opposite sidewalls of the dielectric underlayer, the second portion of the metal layer being in contact with a second portion of the bottommost surface of the magnetic tunnel junction pillar extending outwards from the dielectric underlayer and in contact with a bottommost surface of the sidewall spacers, the second portion of the metal layer providing the bottom electrode.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
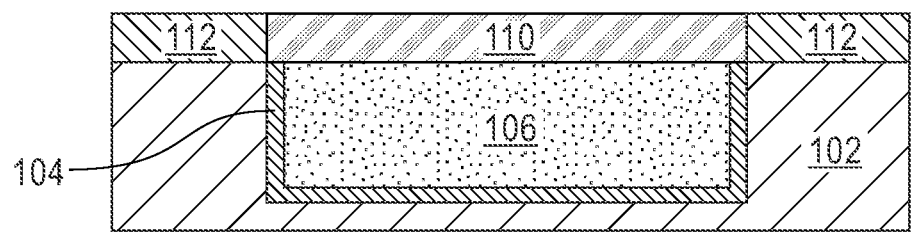
FIG. 1A is a cross-sectional view of a memory device at an intermediate step during a semiconductor manufacturing process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

MRAM devices include cells or magnetic storage elements for storing data having a magnetically hard layer (i.e., the reference layer) and a magnetically soft layer (i.e., the free layer) separated by a thin dielectric layer (i.e., the tunnel barrier). This configuration is known as a magnetic tunnel junction (MTJ) pillar. MTJ pillar structures typically include a cobalt (Co)-based synthetic anti-ferromagnet (SAF), a CoFeB-based reference layer, a MgO-based tunnel barrier, a CoFeB-based free layer, and cap layers containing materials such as tantalum (Ta) and/or ruthenium (Ru).

As previously mentioned, embedded MTJ pillar structures are usually formed by patterning of blanket MTJ stacks. Reactive-ion etch (RIE) and ion beam etch (IBE) processing of such MTJ stacks presents a major challenge, as it typically leads to shorts due to re-sputtering of thick bottom metal layers onto sidewalls of the MTJ stack. Additionally, a polycrystalline metal is typically applied as hardmask material for subtractive patterning of blanket MTJ stacks. In such cases, grain boundaries and defects in the polycrystalline metal hardmask can be transferred into the MTJ pillar during patterning, resulting in MTJ pillars with high circular edge roughness (CER) that can further damage MRAM performance.

Embodiments of the present disclosure provide a memory device, and a method of making the same, in which top and bottom electrodes are simultaneously formed after patterning of the MTJ stack for preventing metal re-sputtering. Specifically, in the proposed embodiments, the MTJ stack is formed on a dielectric underlayer that allows patterning of the MTJ stack without metal re-sputtering from bottom metal layers. Additionally, in the proposed embodiments, the MTJ pillar is formed using an amorphous dielectric hardmask that enables MTJ pillars with reduced CER. In one or more embodiments, the bottom and top electrodes are metallized with single metals (e.g., TaN, TiN, Pt) or with metal nitride liners and metals (e.g., TaN/Ru).

Accordingly, by using an amorphous dielectric hardmask and a dielectric underlayer, embodiments of the present disclosure allow forming MTJ pillars with reduced CER and simultaneously forming top and bottom electrodes after MTJ stack patterning without re-sputtering of thick bottom metal layers onto sidewalls of the MTJ stack. This may decrease the risk of electrical shorts due to metal re-sputtering and increase device yield and reliability.

An embodiment by which a memory device with simultaneously deposited top and bottom electrodes can be formed is described in detailed below by referring to the accompanying drawings in FIGS. 1A-1S. An alternate embodiment by which the memory device with simultaneously deposited top and bottom electrodes can be formed is described in detailed below by referring to the accompanying drawings in FIGS. 2A-2G.

Referring now to FIG. 1A, a cross-sectional view of a memory device 100 at an intermediate step during a semiconductor manufacturing process is shown, according to an embodiment of the present disclosure. The memory device 100 may include any MTJ-containing device such as, for example, MRAM, spin-transfer torque (STT) MRAM, spin-orbit torque (SOT) MRAM and the like. In the embodiment of FIG. 1, the memory device 100 is an MRAM device based on a perpendicular MTJ pillar structure.

The memory device 100 includes a first conductive structure 106 that is embedded in an interconnect dielectric material or first dielectric layer 102. A first diffusion barrier liner 104 can be formed on sidewalls and a bottom surface of the first conductive structure 106, as shown in the figure. Collectively, the first conductive structure 106, the first diffusion barrier liner 104, and the first dielectric layer 102 provide an interconnect level. It should be noted that at least one other interconnect level and/or a middle-of-the-line (MOL) level may be located beneath the interconnect level formed by the first dielectric layer 102, the first conductive structure 106, and the first diffusion barrier liner 104. These other levels are not shown for clarity.

The first dielectric layer 102 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first conductive structure 106 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

As depicted in the figure, the first diffusion barrier liner 104 is formed along a bottom surface and sidewalls of the first conductive structure 106. In some embodiments, no diffusion barrier liner is present. The first diffusion barrier liner 104 is composed of a diffusion barrier material (i.e., a material that serves as a barrier to prevent a conductive material such as copper from diffusing there through). Examples of diffusion barrier materials that can be used in providing the first diffusion barrier liner 104 may include, but are not limited to, Ta, TaN, Ti, TiN, Ru, RuN, RuTa, RuTaN, W, or WN. In some embodiments, the first diffusion barrier liner 104 may include a stack of diffusion barrier materials. In one example, the diffusion barrier material may be composed of a stack of Ta/TaN.

The interconnect level including the first dielectric layer 102, the first conductive structure 106, and the first diffusion barrier liner 104 may be formed utilizing conventional processes that are well-known to those skilled in the art including, for example, a damascene process. So as not to obscure the method of the present application, the techniques used to form the interconnect level including the first dielectric layer 102, the first conductive structure 106, and the first diffusion barrier liner 104 are not provided herein.

The memory device 100 may further include a metal cap 110 formed within a second dielectric layer 112, as depicted in the figure. In one or more embodiments, the second dielectric layer 112 includes analogous materials and is formed in similar ways as the first dielectric layer 102. The metal cap 110 may be provided in cases where the first conductive structure 106 includes a reactive metal such as copper (Cu). In such cases, the metal cap 110 may include a less reactive capping material such as, for example, TaN, WN, and the like. The process of forming the metal cap 110 is standard and well-known in the art. Generally, the process includes depositing the second dielectric layer 112 above the first conductive structure 106 and the first dielectric layer 102, forming a via or trench feature (not shown) in the second dielectric layer 112 using standard patterning (lithography) and etching techniques until exposing the first conductive structure 106, and then filling the via or trench feature with the capping material using well-known conformal deposition processes, such as atomic layer deposition (ALD), or chemical vapor deposition (CVD). A thickness of the metal cap 110 may vary from approximately 5 nm to approximately 200 nm, and ranges therebetween.

Figure 1B:
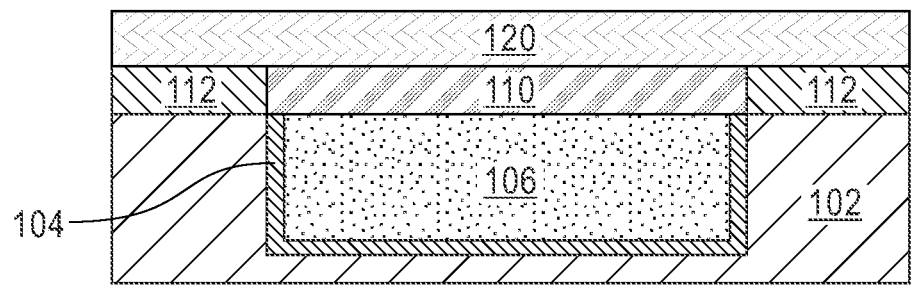
FIG. 1B is a cross-sectional view of the memory device after depositing a dielectric underlayer, according to an embodiment of the present disclosure.

Referring now to FIG. 1B, a cross-sectional view of the memory device 100 is shown after depositing a dielectric underlayer 120, according to an embodiment of the present disclosure.

The dielectric underlayer 120 is formed above top surfaces of the metal cap 110 and second dielectric layer 112. In this embodiment, the dielectric underlayer 120 may include a layer of a dielectric material such as, for example, $SiO_2$, SiON, and the like. The dielectric underlayer 120 may be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) may follow the deposition of the dielectric material that provides the dielectric underlayer 120. The dielectric underlayer 120 may have a thickness varying from approximately 2 nm to approximately 25 nm and ranges there between, although a thickness less than 2 nm and greater than 25 nm may be acceptable.

Figure 1C:
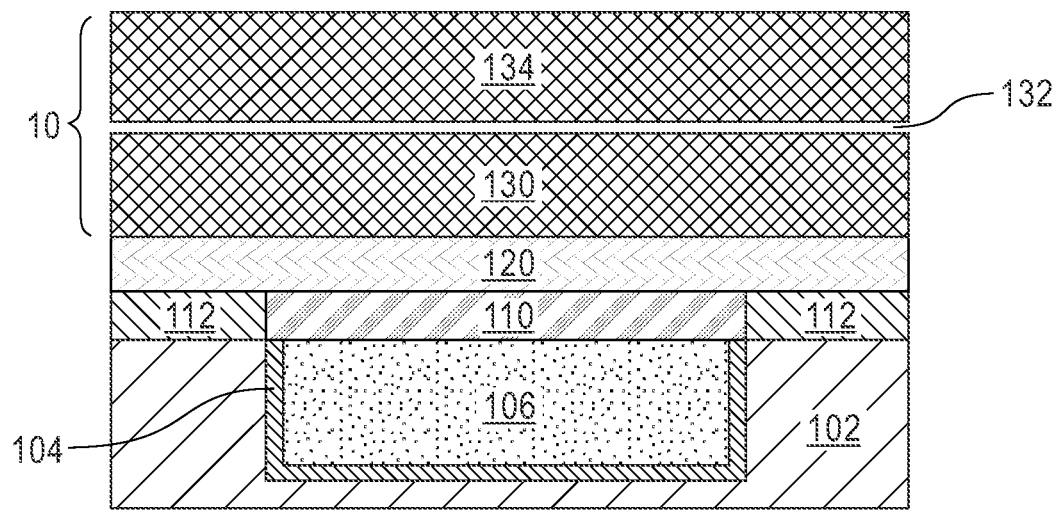
FIG. 1C is a cross-sectional view of the memory device after forming a magnetic tunnel junction stack above the dielectric underlayer, according to an embodiment of the present disclosure.

Referring now to FIG. 1C, a cross-sectional view of the memory device 100 is shown after forming an MTJ stack 10 above the dielectric underlayer 120, according to an embodiment of the present disclosure. The MTJ stack 10 may include at least a magnetic reference layer 130, a tunnel barrier layer 132, and a magnetic free layer 134 as depicted in the figure. It should be noted that other configurations are possible for the MTJ stack 10 including, for example, the magnetic free layer 134 being located at the bottom of the MTJ stack 10 and the magnetic reference layer 130 being at the top of the MTJ stack 10.

In some embodiments, the MTJ stack 10 may also include a non-magnetic spacer layer (not shown) located on the magnetic free layer, a second magnetic free layer located on the non-magnetic spacer layer, and/or a MTJ cap layer located on the magnetic free layer 134 or on the second magnetic free layer. The various material layers of the MTJ stack 10 can be formed by utilizing one or more deposition processes such as, for example, plating, sputtering, plasma enhanced atomic layer deposition (PEALD), plasma enhanced chemical vapor deposition (PECVD) or physical vapor deposition (PVD).

The magnetic reference layer 130 has a fixed magnetization. The magnetic reference layer 130 may be composed of a metal or metal alloy (or a stack thereof) that includes one or more metals exhibiting high spin polarization. In alternative embodiments, exemplary metals for the formation of the magnetic reference layer 130 may include iron, nickel, cobalt, chromium, boron, or manganese. Exemplary metal alloys may include the metals exemplified by the above. In another embodiment, the magnetic reference layer 130 may be a multilayer arrangement having (1) a high spin polarization region formed from a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 132 is composed of an insulator material and is formed at such a thickness as to provide an appropriate tunneling resistance. Exemplary materials for the tunnel barrier layer 132 may include magnesium oxide, aluminum oxide, and titanium oxide, or materials of higher electrical tunnel conductance, such as semiconductors or low-bandgap insulators.

The magnetic free layer 134 may be composed of a magnetic material (or a stack of magnetic materials) with a magnetization that can be changed in orientation relative to the magnetization orientation of the magnetic reference layer 130. Exemplary magnetic materials for the magnetic free layer 134 include alloys and/or multilayers of cobalt, iron, alloys of cobalt-iron, nickel, alloys of nickel-iron, and alloys of cobalt-iron-boron.

Figure 1D:
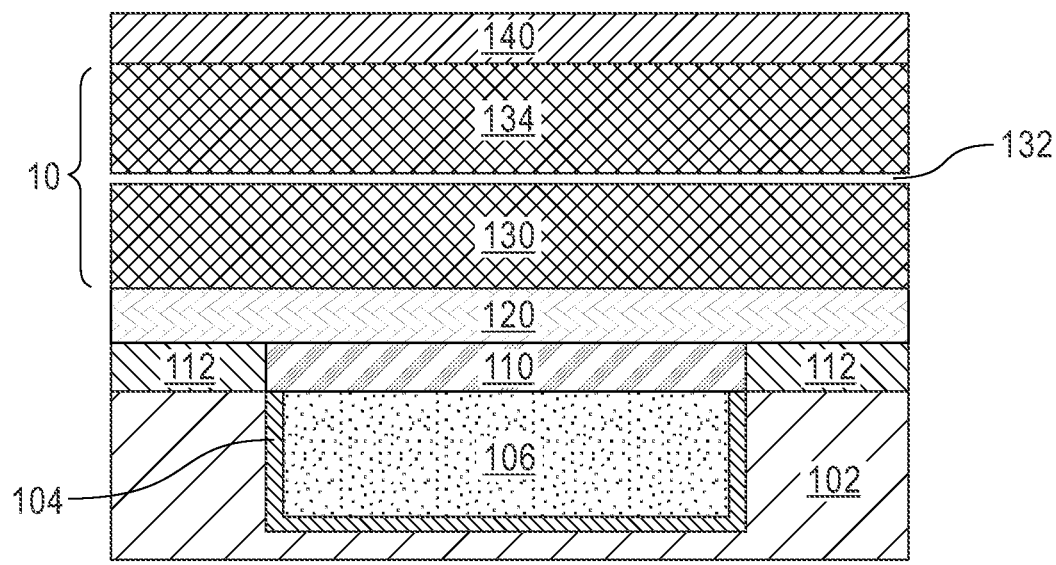
FIG. 1D is a cross-sectional view of the memory device after forming a dielectric hardmask above the magnetic tunnel junction stack, according to an embodiment of the present disclosure.

Referring now to FIG. 1D, a cross-sectional view of the memory device 100 is shown after forming a dielectric hardmask 140 above the MTJ stack 10, according to an embodiment of the present disclosure.

In the depicted embodiment, the dielectric hardmask 140 is formed above the magnetic free layer 134 of the MTJ stack 10. The dielectric hardmask 140 includes an amorphous dielectric material. Non-limiting examples of dielectric materials for forming the (amorphous) dielectric hardmask 140 may include aluminum oxide ($Al_2O_3$), titanium dioxide ($TiO_2$), hafnium oxide ($HfO_2$), and the like. The dielectric hardmask 140 can be deposited by any suitable deposition method known in the art including, for example, atomic layer deposition (ALD), or chemical vapor deposition (CVD). A (vertical) thickness of the dielectric hardmask 140 may vary between approximately 10 nm to approximately 100 nm, although other thicknesses above or below this range may be used as desired for a particular application.

Figure 1E:
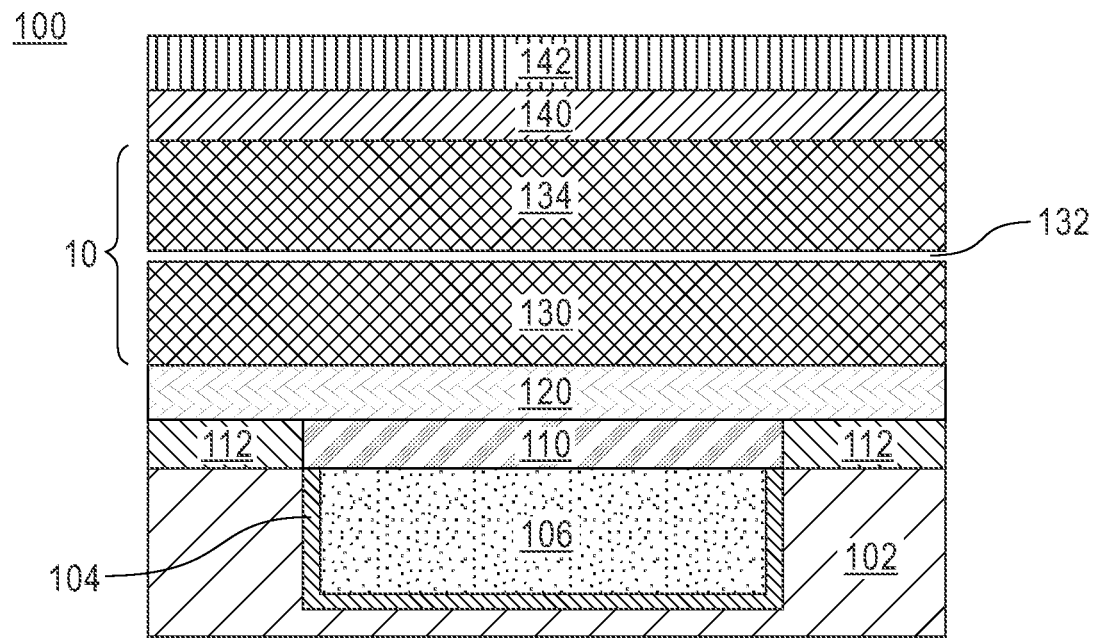
FIG. 1E is a cross-sectional view of the memory device after forming a top dielectric layer above the dielectric hardmask, according to an embodiment of the present disclosure.

Referring now to FIG. 1E, a cross-sectional view of the memory device 100 is shown after forming a top dielectric layer 142 above the dielectric hardmask 140, according to an embodiment of the present disclosure.

The top dielectric layer 142 can be formed by depositing a layer of a dielectric material using any suitable deposition process including, for example, CVD. In an exemplary embodiment, the dielectric material forming the top dielectric layer 142 may include silicon nitride (SiN). In one or more embodiments, a (vertical) thickness of the top dielectric layer 142 may vary between approximately 10 nm to approximately 100 nm, although other thicknesses above or below this range may be used as desired for a particular application.

Figure 1F:
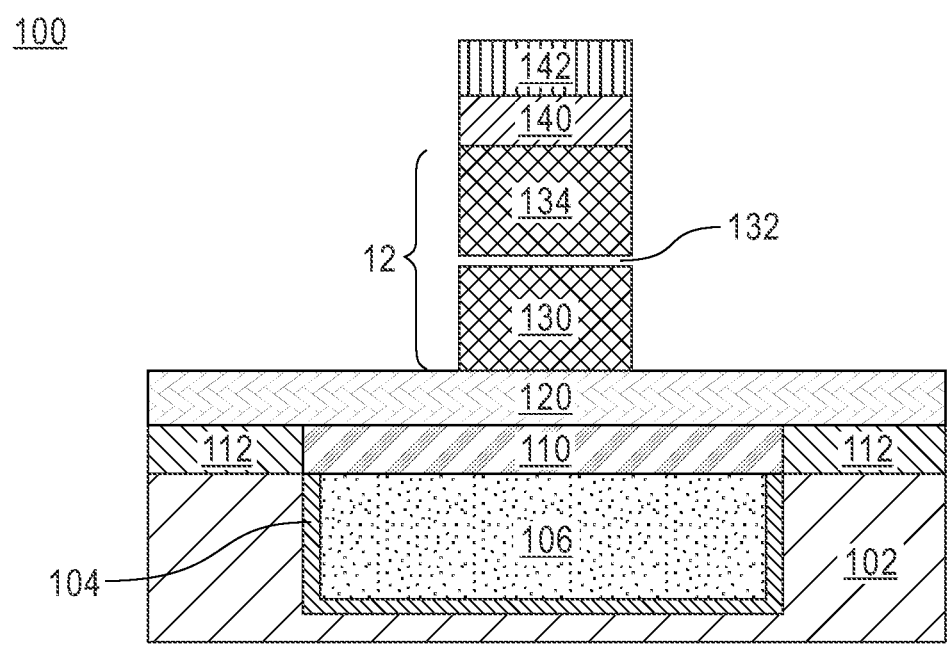
FIG. 1F is a cross-sectional view of the memory device after patterning the magnetic tunnel junction stack to form a magnetic tunnel junction pillar, according to an embodiment of the present disclosure.

Referring now to FIG. 1F, a cross-sectional view of the memory device 100 is shown after patterning the MTJ stack 10 (FIG. 1E) to form an MTJ pillar 12, according to an embodiment of the present disclosure.

The process of patterning the MTJ stack 10 (FIG. 1E) consists of steps well-known in the art, which generally include forming a pattern on a photoresist layer (not shown) that is transferred to the top dielectric layer 142 and dielectric hardmask 140, and then used to pattern the underlying MTJ stack 10 via any suitable etching technique. Non-limiting examples of etching techniques for patterning the MTJ stack 10 (FIG. 1E) may include reactive-ion etching (RIE) or ion beam etching (IBE). In this embodiment, etching of the MTJ stack 10 (FIG. 1E) is conducted until reaching a top surface of the dielectric underlayer 120.

Thus, according to an embodiment, deposition of the dielectric hardmask 140 composed of an amorphous dielectric material during MRAM stack patterning, instead of a polycrystalline metal hardmask, may prevent the transfer of grain boundaries and defects into the MTJ pillar 12 thereby substantially reducing circular edge roughness (CER). Additionally, the presence of the dielectric underlayer 120 may prevent metal re-sputtering of underlying bottom metal layers onto sidewalls of the MTJ pillar 12 during the patterning process.

It should be noted that some elements and/or features of the memory device 100 are illustrated in the figures but not described in detail in order to avoid unnecessarily obscuring the presented embodiments. For illustration purposes only, without intent of limitation, only one MTJ pillar 12 is depicted in the figure. As may be understood by those skilled in the art, more than one MTJ pillar 12 can be formed in the memory device 100.

Figure 1G:
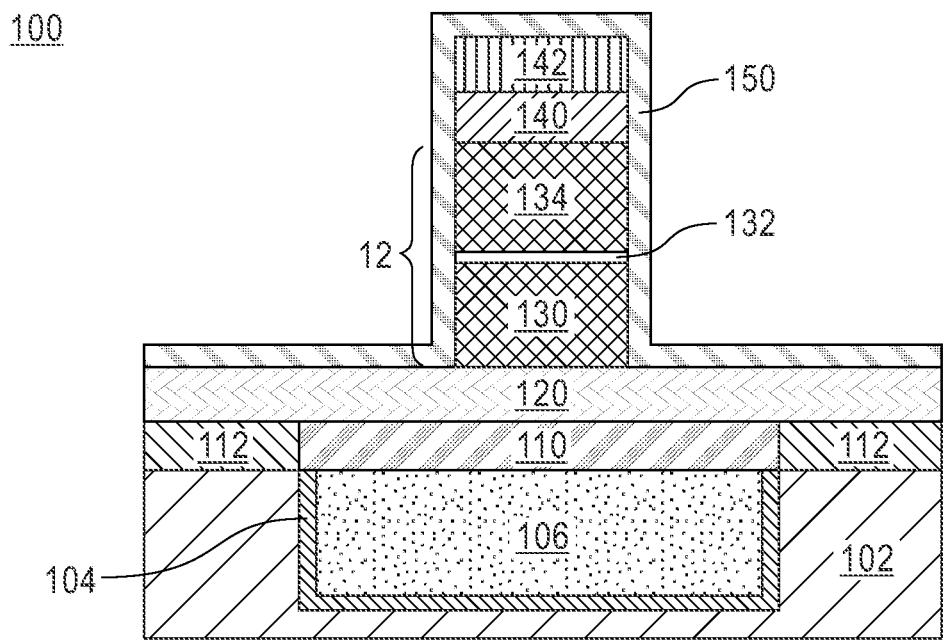
FIG. 1G is a cross-sectional view of the memory device after forming a spacer material, according to an embodiment of the present disclosure.

Referring now to FIG. 1G, a cross-sectional view of the memory device 100 is shown after forming a spacer material 150, according to an embodiment of the present disclosure.

The spacer material 150 may include an insulator material such as an oxide, nitride, oxynitride, silicon carbon oxynitride, silicon boron oxynitride, low-k dielectric, or any combination thereof. In one or more embodiments, the spacer material 150 is identical to the dielectric material forming the top dielectric layer 142 (e.g., SiN).

Standard conformal deposition techniques may be used to form the spacer material 150. The spacer material 150 can be deposited on the memory device 100 and then etched to form sidewall spacers, as will be described in detail below.

Figure 1H:
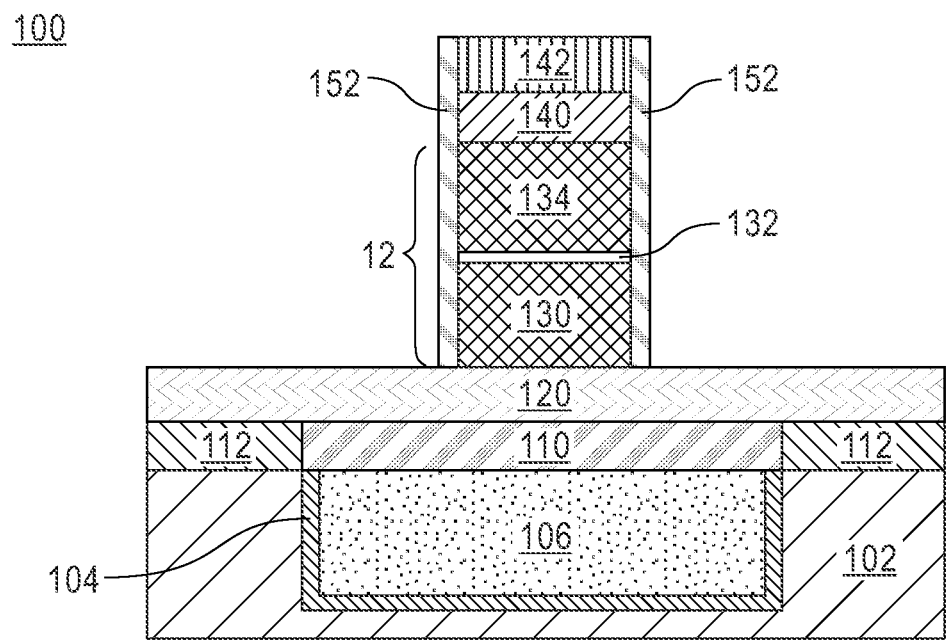
FIG. 1H is a cross-sectional view of the memory device after etching the spacer material to form sidewall spacers, according to an embodiment of the present disclosure.

Referring now to FIG. 1H, a cross-sectional view of the memory device 100 is shown after etching the spacer material 150 (FIG. 1G) and forming sidewall spacers 152, according to an embodiment of the present disclosure.

The spacer material 150 (FIG. 1G) can be etched using, for example, an anisotropic etch to form the sidewall spacers 152. As depicted in the figure, the spacer material 150 (FIG. 1G) is removed from all horizontal surfaces of the memory device 100 during the etching process.

According to an embodiment, the sidewall spacers 152 are located along sidewalls of the MTJ pillar 12, dielectric hardmask 140, and top dielectric layer 142 substantially covering this region of the memory device 100. Stated differently, the sidewall spacers 152 act as an encapsulation layer that substantially surrounds and protects the MTJ pillar 12 during subsequent processing steps. In an exemplary embodiment, a (horizontal) thickness of the sidewall spacers 152, as configured in FIG. 1H, may vary between approximately 3 nm to approximately 40 nm, although other thicknesses above or below this range may be used as desired for a particular application.

Figure 1I:
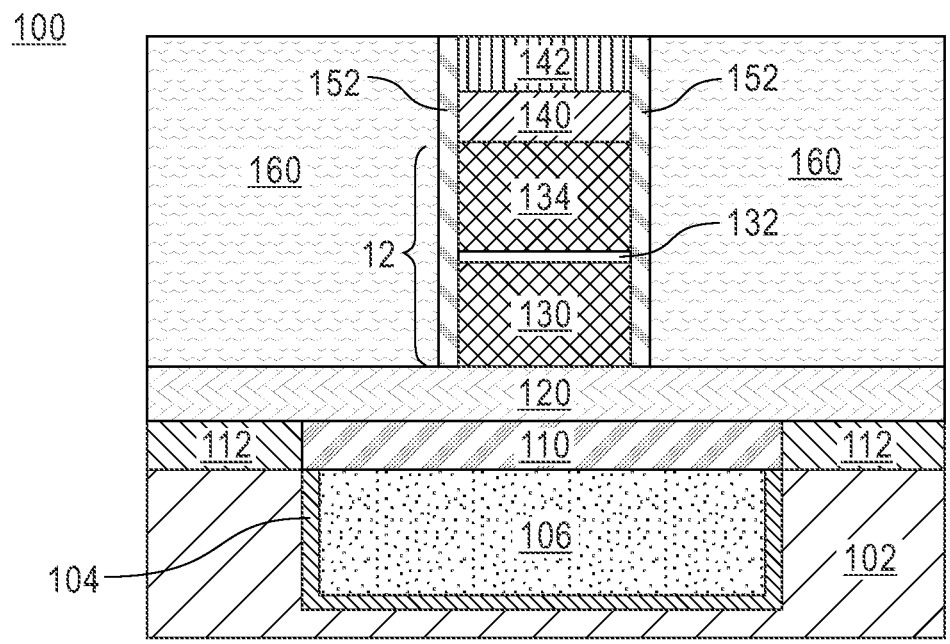
FIG. 1I is a cross-sectional view of the memory device after forming a third dielectric layer, according to an embodiment of the present disclosure.

Referring now to FIG. 1I, a cross-sectional view of the memory device 100 is shown after forming a sacrificial dielectric layer or third dielectric layer 160, according to an embodiment of the present disclosure.

The third dielectric layer 160 may be made of analogous materials and formed in similar ways as the first dielectric layer 102 and second dielectric layer 112. In an exemplary embodiment, the third dielectric layer 160 may be composed of at least one of silicon dioxide ($SiO_2$) and silicon oxynitride (SiON). A planarization process may be conducted on the memory device 100 after deposition of the third dielectric layer 160.

Figure 1J:
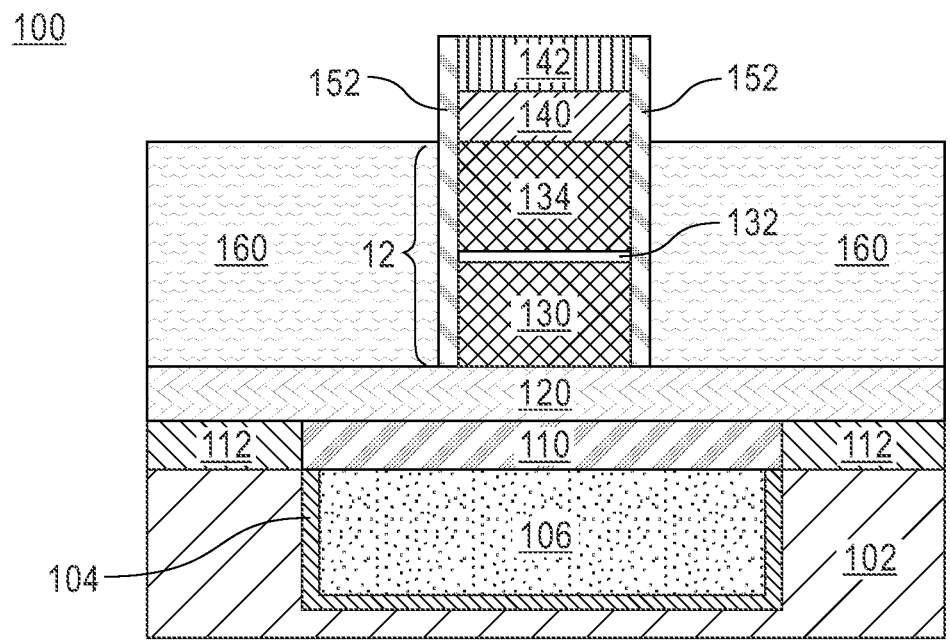
FIG. 1J is a cross-sectional view of the memory device after recessing the third dielectric layer, according to an embodiment of the present disclosure.

Referring now to FIG. 1J, a cross-sectional view of the memory device 100 is shown after recessing the third dielectric layer 160, according to an embodiment of the present disclosure.

Non-limiting examples of etching techniques for recessing the third dielectric layer 160 may include wet removal or selective dry etch. Recessing the third dielectric layer 160 exposes upper lateral portions of the sidewall spacers 152 covering or deposited along sidewalls of the dielectric hardmask 140 and top dielectric layer 142. The process of recessing the third dielectric layer 160 may be conducted until a (vertical) thickness of the third dielectric layer 160 is similar to a height of the MTJ pillar 12, as depicted in the figure.

Figure 1K:
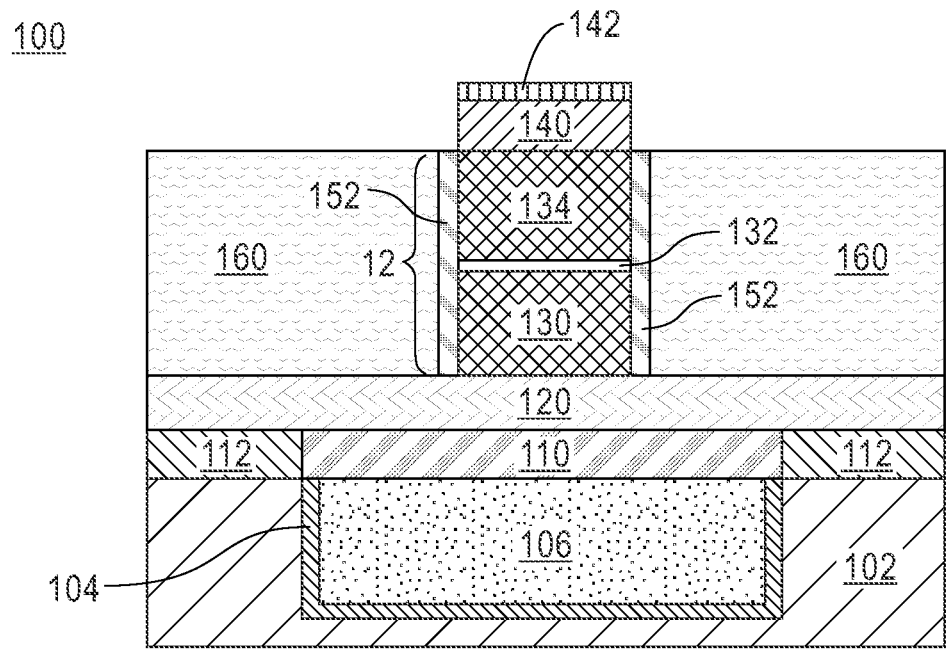
FIG. 1K is a cross-sectional view of the memory device after conducting a first etching process to remove portions of the sidewall spacers exposed after recessing the third dielectric layer, according to an embodiment of the present disclosure.

Referring now to FIG. 1K, a cross-sectional view of the memory device 100 is shown after conducting a first etching process to remove portions of the sidewall spacers 152 exposed after recessing the third dielectric layer 160, according to an embodiment of the present disclosure.

In this embodiment, portions of the sidewall spacers 152 exposed after recessing the third dielectric layer 160 may be selectively removed using an isotropic etching process. Non-limiting examples of isotropic etching techniques for removing the exposed portions of the sidewall spacer 152 (depicted in FIG. 1J) may include dry etch, or a wet removal process.

In embodiments in which the dielectric material forming the top dielectric layer 142 is different from the dielectric material forming the sidewall spacers 152, a second etching process can be conducted to recess the top dielectric layer 142 after removing the exposed portions of the sidewall spacers 152. In such embodiments, the top dielectric layer 142 may be recessed using, for example, an isotropic etching technique until a thickness of the top dielectric layer 142 is between approximately 40 nm to approximately 20 nm.

Figure 1L:
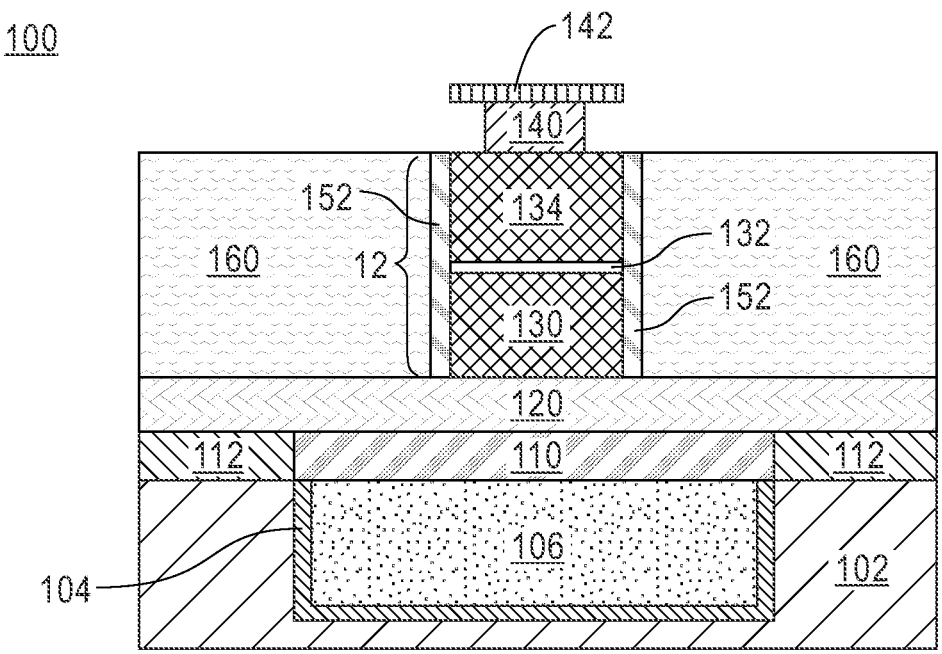
FIG. 1L is a cross-sectional view of the memory device after laterally recessing the dielectric hardmask, according to an embodiment of the present disclosure.

Referring now to FIG. 1L, a cross-sectional view of the memory device 100 is shown after laterally recessing the dielectric hardmask 140, according to an embodiment of the present disclosure.

As depicted in the figure, the dielectric hardmask 140 is laterally recessed until a (horizontal) thickness of the dielectric hardmask 140 varies between approximately 10 nm and 20 nm, and ranges therebetween. In an exemplary embodiment, a reactive ion etch (RIE) or wet removal process may be used to recess the dielectric hardmask 140 selective to the top dielectric layer 142 and MTJ pillar 12. Laterally recessing the (amorphous) dielectric hardmask 140 exposes top surfaces of the MTJ pillar 12 (i.e., the magnetic free layer 134), which allows electrically connecting the MTJ pillar 12 to subsequently formed conductive structures.

Figure 1M:
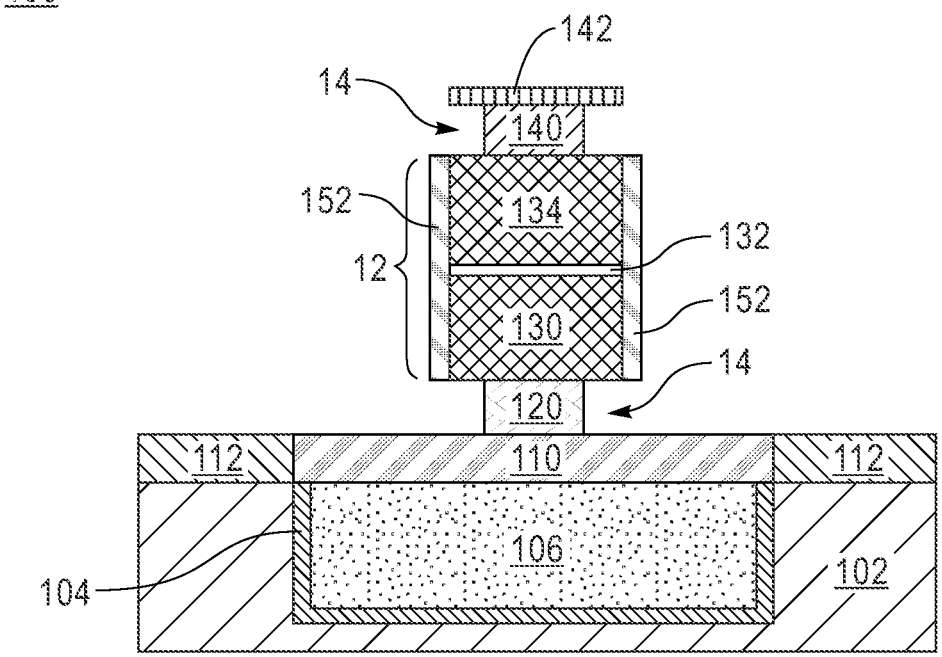
FIG. 1M is a cross-sectional view of the memory device after removing the third dielectric layer and laterally recessing the dielectric underlayer, according to an embodiment of the present disclosure.

Referring now to FIG. 1M, a cross-sectional view of the memory device 100 is shown after removing the third dielectric layer 160 and laterally recessing the dielectric underlayer 120, according to an embodiment of the present disclosure.

Standard etching techniques (e.g., RIE) can be used to remove the third dielectric layer 160 from the memory device 100. Removing the third dielectric layer 160 exposes the MTJ pillar 12 and dielectric underlayer 120.

After removing the third dielectric layer 160, the dielectric underlayer 120 can be laterally recessed similarly to the dielectric hardmask 140 (described above in FIG. 1L). In an embodiment, the dielectric underlayer 120 is laterally recessed until a (horizontal) thickness of the dielectric underlayer 120 varies between approximately 10 nm and 20 nm, and ranges therebetween. Dry etching techniques (e.g., RIE or IBE) or wet etch removal can be used to laterally etch the dielectric underlayer 120. It should be noted that both etching steps can be done at the same time with one etch process, for example RIE, or wet etch removal. However, since RIE is predominantly directional, a two-step process (e.g., first RIE removal, then wet etch removal) is the more relevant sequence of steps.

After the etching process, portions of the dielectric hardmask 140 and dielectric underlayer 120 remain in contact with a central top region and a central bottom region, respectively, of the MTJ pillar 12. Recesses 14 are formed on opposite sides of the remaining portions of the dielectric hardmask 140 and dielectric underlayer 120. As can be observed in the figure, the recesses 14 expose top and bottom surfaces of the MTJ pillar 12 and a top surface of the metal cap 110 for electrically connecting the MTJ pillar 12 to conductive structures formed in the memory device 100.

Figure 1N:
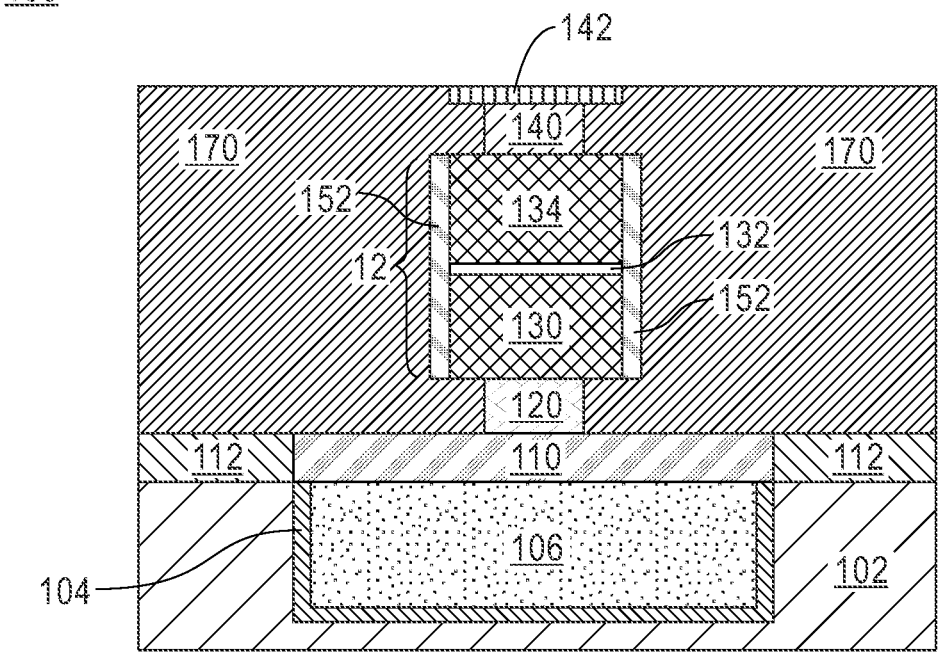
FIG. 1N is a cross-sectional view of the memory device after depositing a first metal layer, according to an embodiment of the present disclosure.

Referring now to FIG. 1N, a cross-sectional view of the memory device 100 is shown after depositing a first metal layer 170, according to an embodiment of the present disclosure.

The first metal layer 170 can be conformally deposited on the memory device 100 using, for example, an atomic layer deposition (ALD) process. The first metal layer 170 may be composed of an electrically conductive material such as, for example, Ta, TaN, Ti, TiN, Ru, RuN, RuTa, RuTaN, W, WN or any combination thereof. The first metal layer 170 substantially fills the recesses 14 depicted in FIG. 1M.

Figure 1O:
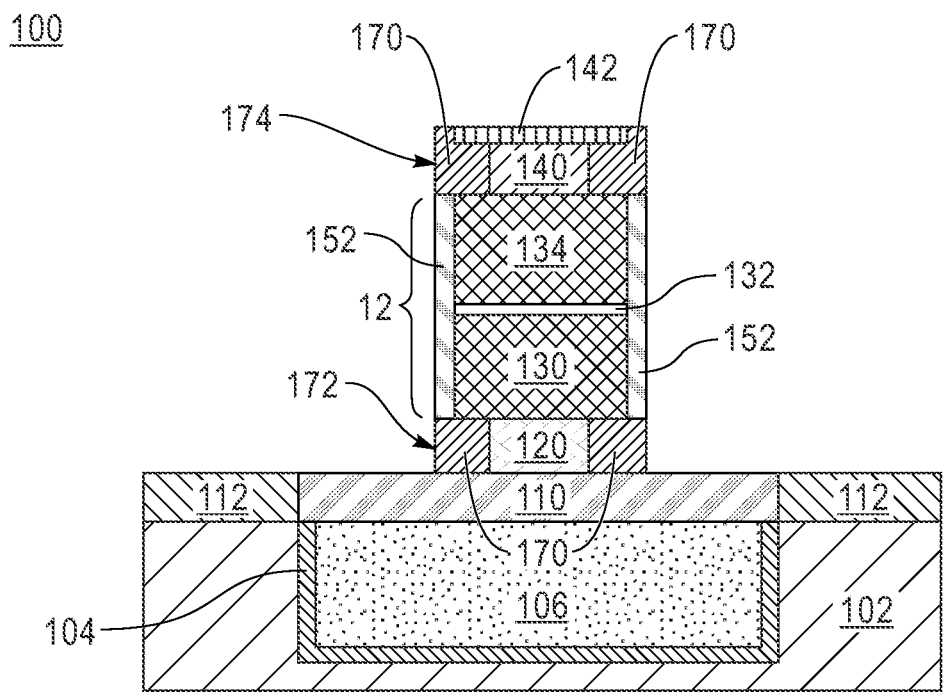
FIG. 1O is a cross-sectional view of the memory device after etching the first metal layer, according to an embodiment of the present disclosure.

Referring now to FIG. 1O, a cross-sectional view of the memory device 100 is shown after etching the first metal layer 170, according to an embodiment of the present disclosure.

In this embodiment, an etch back process is conducted on the first metal layer 170. After conducting the etch back process, the first metal layer 170 remains on opposite sidewalls of the dielectric hardmask 140 and above an uppermost (exposed) surface of the MTJ pillar 12 and sidewall spacers 152. Similarly, the first metal layer 170 remains on opposite sidewalls of the dielectric underlayer 120, below a bottommost (exposed) surface of the MTJ pillar 12 and sidewall spacers 152, and above a top surface of the metal cap 110 (not covered by the dielectric underlayer 120). Thus, the first metal layer 170 is in direct contact with top and bottom portions of the MTJ pillar 12 for providing a top electrode 174 and a bottom electrode 174, as shown in the figure.

According to the proposed embodiments, recessing the dielectric hardmask 140 and the dielectric underlayer 120 after patterning the MTJ pillar 12 allow simultaneously forming the top electrode 174 and the bottom electrode 172 while preventing metal re-sputtering of underlying bottom metal layers onto sidewalls of the MTJ pillar 12.

Remaining portions of the first metal layer 170 forming the top electrode 174 and the bottom electrode 172 may have a thickness varying from approximately 2 nm to approximately 25 nm and ranges there between, although a thickness less than 2 nm and greater than 25 nm may be acceptable.

Figure 1P:
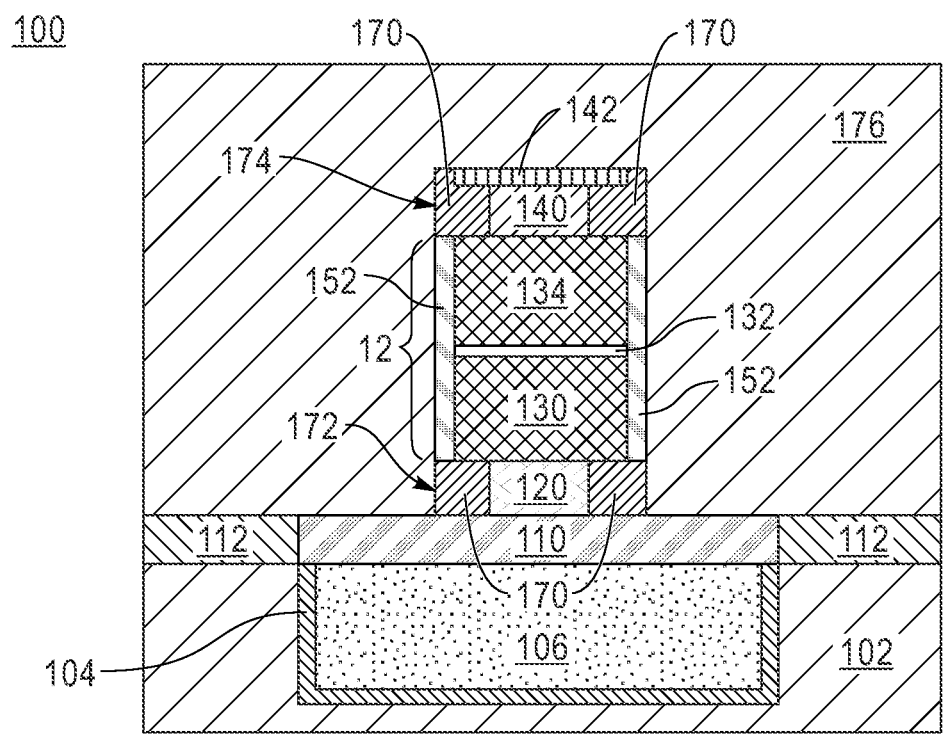
FIG. 1P is a cross-sectional view of the memory device after forming an interlevel dielectric filling layer or fourth dielectric layer, according to an embodiment of the present disclosure.

Referring now to FIG. 1P, a cross-sectional view of the memory device 100 is shown after forming an interlevel dielectric filling layer or fourth dielectric layer 176, according to an embodiment of the present disclosure.

The fourth dielectric layer 176 may be made of analogous materials and formed in similar ways as the first, second and third dielectric layers 102, 112, 160 (FIG. 1L). In some embodiments, a planarization process may be conducted on the memory device 100 after deposition of the fourth dielectric layer 176.

Figure 1Q:
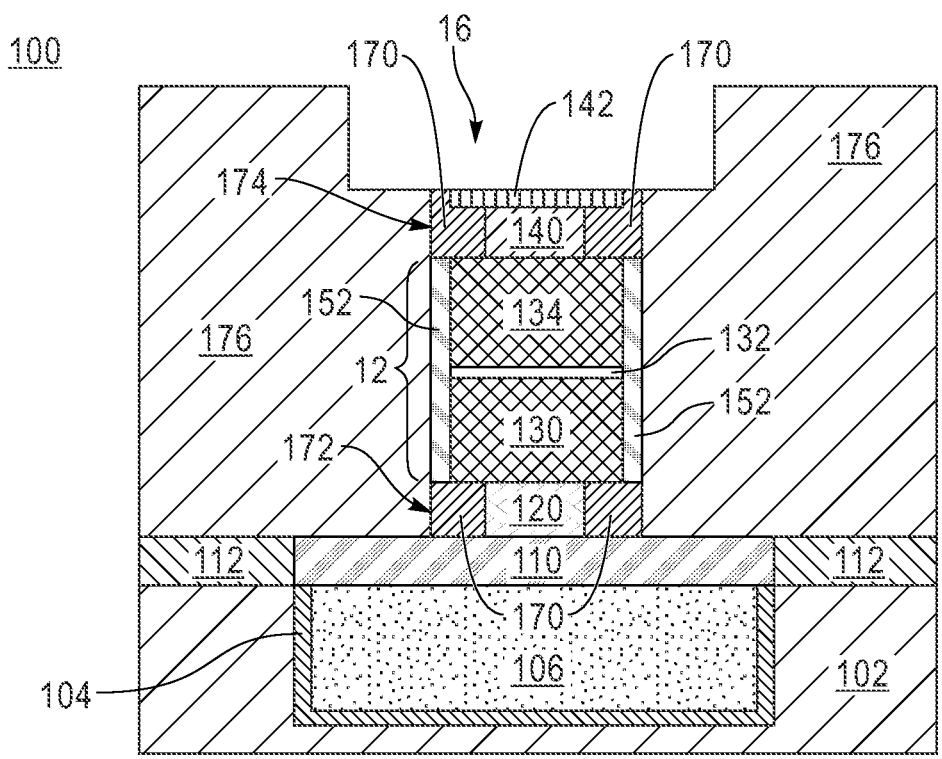
FIG. 1Q is a cross-sectional view of the memory device after top contact patterning, according to an embodiment of the present disclosure.
Figure 1R:
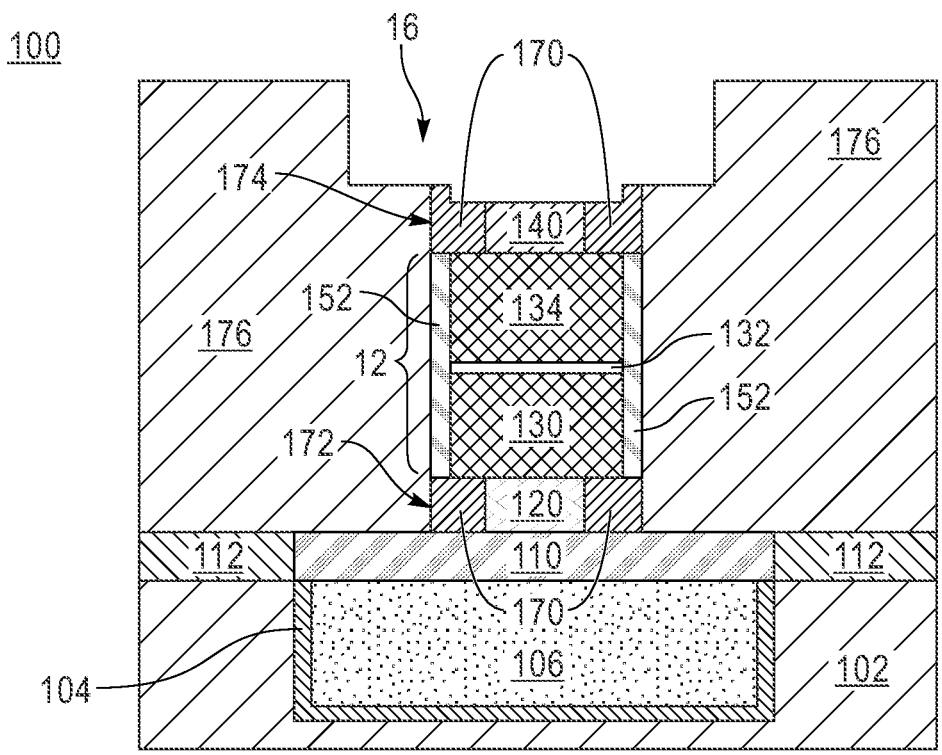
FIG. 1R is a cross-sectional view of the memory device after removing the top dielectric layer, according to an embodiment of the present disclosure.

Referring now to FIG. 1Q and FIG. 1R simultaneously, cross-sectional views of the memory device 100 are shown after top contact patterning and removing the top dielectric layer 142, according to an embodiment of the present disclosure.

In this embodiment, top contact patterning may be performed in the fourth dielectric layer 176 in accordance with typical techniques. For example, top contact patterning can be conducted using a dual damascene technique by which a contact trench 16 is formed in the fourth dielectric layer 176 and subsequently filled with a conductive interconnect material, as will be described in detail below.

As depicted in FIG. 1Q, the contact trench 16 exposes an uppermost surfaces of the top dielectric layer 142. According to an embodiment, the top dielectric layer 142 can be selectively removed from the memory device 100, as depicted in FIG. 1R. Non-limiting examples of etching processes to remove the top dielectric layer 142 may include dry methods such RIE, or wet removal.

Removal of the top dielectric layer 142 reveals or uncovers top surfaces of the dielectric hardmask 140 and top electrode 174. As can be observed in FIG. 1R, an uppermost surface of the top electrode 174 has a stepped shape in which (opposite) first top surfaces of the top electrode 174 are coplanar with the fourth dielectric layer 176 and a second (central) top surface of the top electrode 174 is coplanar with a top surface of the dielectric hardmask 140.

Figure 1S:
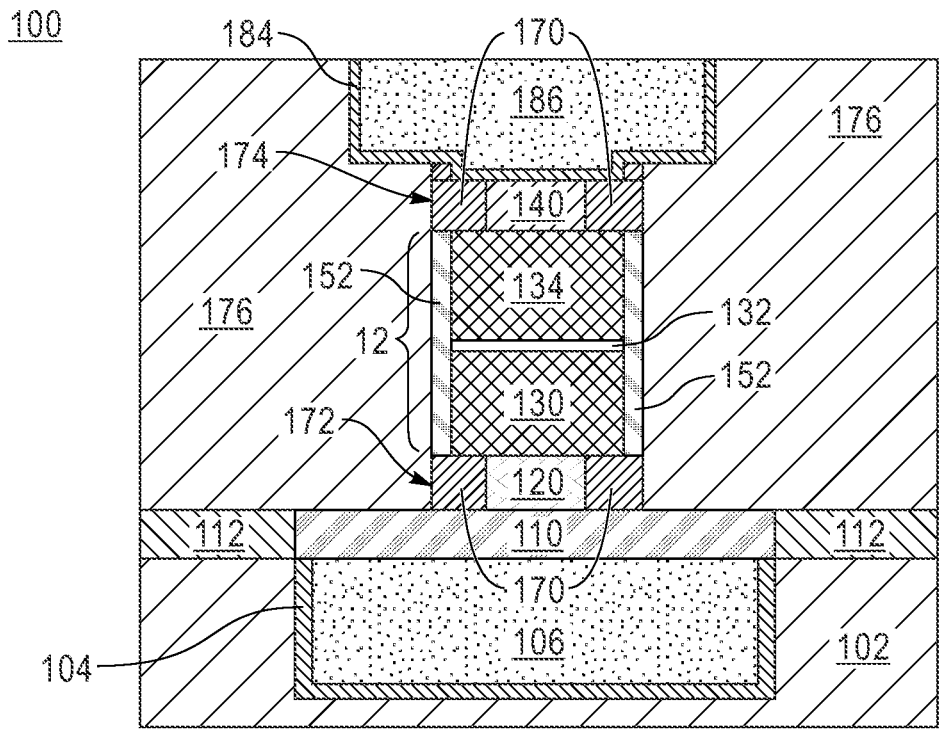
FIG. 1S is a cross-sectional view of the memory device after forming a second conductive structure, according to an embodiment of the present disclosure.

Referring now to FIG. 1S, a cross-sectional view of the memory device 100 is shown after forming a second conductive structure 186, according to an embodiment of the present disclosure.

Forming the second conductive structure 186 includes depositing a conductive interconnect material within the contact trench 16 (FIG. 1R). In one or more embodiments, a second diffusion barrier liner 184 can be formed prior to depositing the conductive interconnect material. In such embodiments, the second diffusion barrier liner 184 can be formed on a bottom surface and sidewalls of the second conductive structure 186, as shown in the figure. In the depicted embodiment, a first portion of the second conductive structure 186 is located above the dielectric hardmask 140, while a second portion of the second conductive structure 186 is in contact with the top electrode 174 for electrically connecting the second conductive structure 186 to the MTJ pillar 12.

Similar to the first conductive structure 106, the second conductive structure 186 may be composed of a conductive interconnect material such as Cu, Al, or W, while the second barrier liner 184 may include Ta, TaN, Ti, TiN, Ru, RuN, RuTa, RuTaN, W, or WN. The conductive interconnect material may be formed using a filling technique such as electroplating, electroless plating, chemical vapor deposition, physical vapor deposition or a combination of methods. A seed layer (not shown) may optionally be deposited prior to filling the trench using an electroplating technique. In one or more embodiments, a planarization process is conducted after forming the second conductive structure 186.

As depicted in the figure, the (amorphous) dielectric hardmask 140 is in contact with a first (middle or center) portion of an uppermost surface of the MTJ pillar 12, while a first portion of the first metal layer 170 disposed on opposite sidewalls of the (amorphous) dielectric hardmask 140 is in contact with a second portion of the uppermost surface of the MTJ pillar 12 extending outwards from the dielectric hardmask 140 (i.e., the portion of the MTJ pillar 12 not covered by the dielectric hardmask 140) and an uppermost surface of the sidewall spacers 152 for providing the top electrode 174. Similarly, a second portion of the first metal layer 170 disposed on opposite sidewalls of the dielectric underlayer 120 is in contact with a second portion of the bottommost surface of the MTJ pillar 12 extending outwards from the dielectric underlayer 120 (i.e., the portion of the MTJ pillar 12 not covered by the dielectric underlayer 120) and a bottommost surface of the sidewall spacers for providing the bottom electrode 172.

The following described figures provide an alternate embodiments by which the memory device 100 can be formed using the dielectric underlayer 120 and dielectric hardmask 140.

Figure 2A:
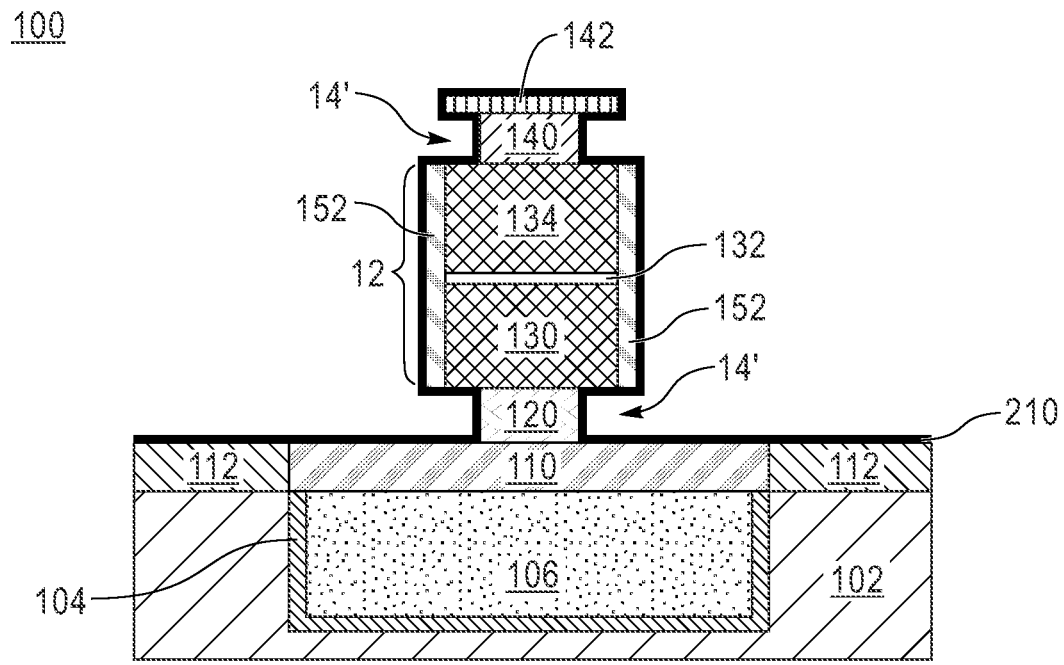
FIG. 2A is a cross-sectional view of the memory device after depositing a metal liner, according to an alternate embodiment of the present disclosure.

Referring now to FIG. 2A, a cross-sectional view of the memory device 100 is shown after depositing a metal liner 210, according to an alternate embodiment of the present disclosure.

In this embodiment, after the steps of removing the third dielectric layer 160 and laterally recessing the dielectric underlayer 120 described in FIG. 1M above, the metal liner 210 can be conformally deposited in the memory device 100. The metal liner 210 can be conformally deposited on the memory device 100 using, for example, an atomic layer deposition (ALD) process or a chemical vapor deposition (CVD) process. In an exemplary embodiment, the metal liner 210 may include a layer of a metal nitride material such as TaN or TiN. The metal liner 210 may have a thickness varying from approximately 2 nm to approximately 10 nm, although other thicknesses above or below this range may be used as desired for a particular application.

In this embodiment, the metal liner 210 deposits within a perimeter of the recesses 14 depicted in FIG. 1M. However, unlike the first metal layer 170 (FIG. 1N), the metal liner 210 does not completely fill the recesses 14 (FIG. 1M). Instead, after depositing the metal liner 210 cavities or openings 14' remain within inner sidewalls of the metal liner 210, as depicted in the figure.

Figure 2B:
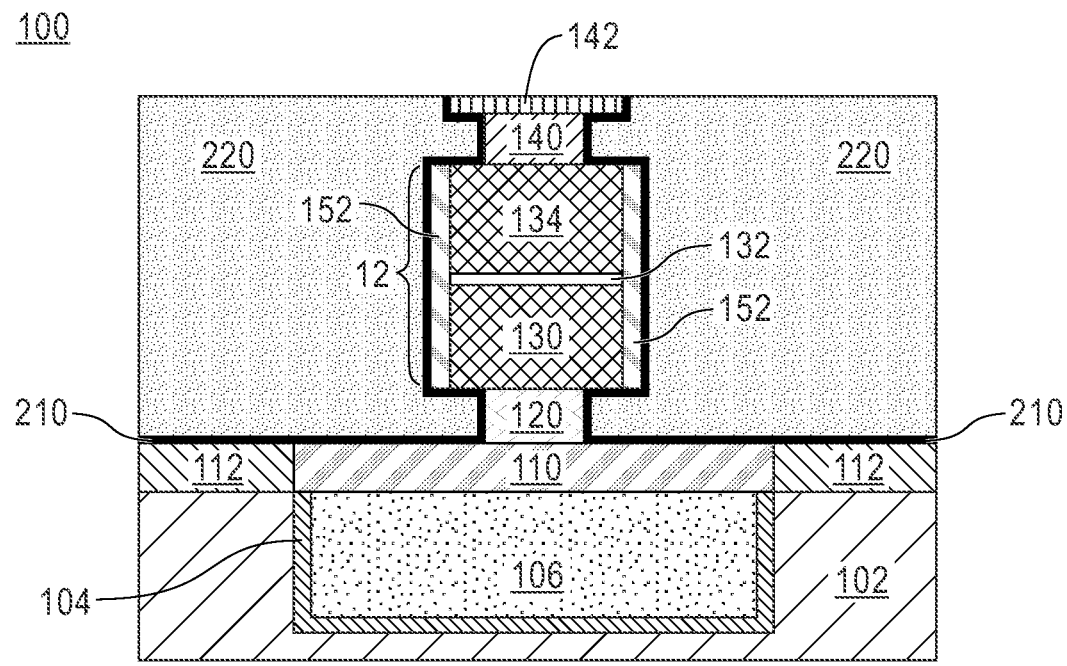
FIG. 2B is a cross-sectional view of the memory device after depositing a second metal layer above the metal liner, according to an alternate embodiment of the present disclosure.

Referring now to FIG. 2B, a cross-sectional view of the memory device 100 is shown after depositing a second metal layer 220 above the metal liner 210 and conducting a planarization process, according to an alternate embodiment of the present disclosure.

The process continues by depositing the second metal layer 220. The second metal layer 220 is formed above and in direct contact with the metal liner 210. The second metal layer 220 can be conformally deposited on the memory device 100 using, for example, ALD or CVD processes. Similar to the first metal layer 170, the second metal layer 220 may be composed of an electrically conductive material such as, for example, Ta, TaN, Ti, TiN, Ru, RuN, RuTa, RuTaN, W, WN or any combination thereof. In one embodiment, the second metal layer 220 is composed of at least one of Ru, Pt, and Ir. The second metal layer 220 substantially fills the cavities 14' depicted in FIG. 2A. A planarization process can be conducted on the memory device 100 after forming the second metal layer 220.

Figure 2C:
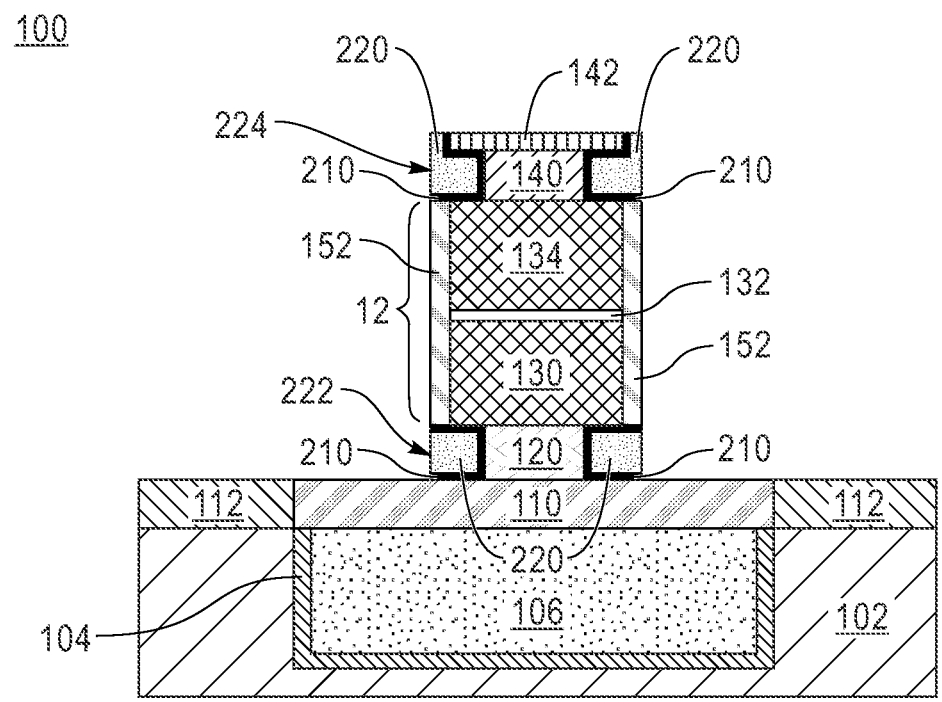
FIG. 2C is a cross-sectional view of the memory device after etching the second metal layer, according to an alternate embodiment of the present disclosure.
Figure 2D:
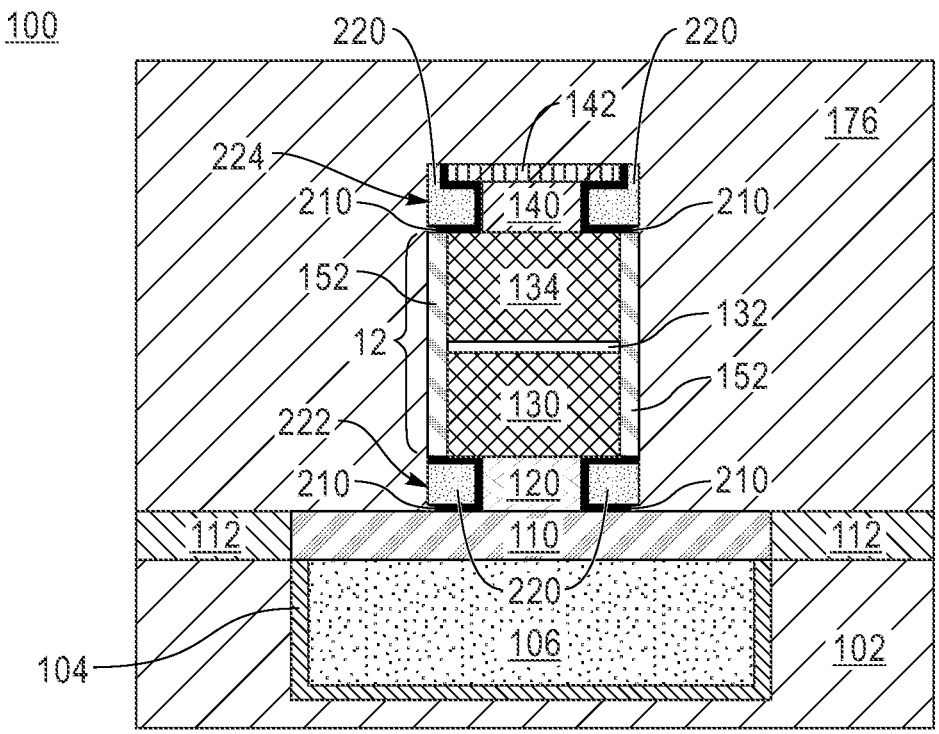
FIG. 2D is a cross-sectional view of the memory device after forming the interlevel dielectric filling layer or fourth dielectric layer, according to an alternate embodiment of the present disclosure.

Referring now to FIG. 2C, a cross-sectional view of the memory device 100 is shown after etching the second metal layer 220, according to an embodiment of the present disclosure.

Similar to the etch back step described in FIG. 1O, an etch back process is conducted on the second metal layer 220 and metal liner 210. After conducting the etch back process, the second metal layer 220 and metal liner 210 remain on opposite sidewalls of the dielectric hardmask 140 and above an uppermost (exposed) surface of the MTJ pillar 12 and sidewall spacers 152. Similarly, the second metal layer 220 and metal liner 210 remains on opposite sidewalls of the dielectric underlayer 120, below a bottommost (exposed) surface of the MTJ pillar 12 and sidewall spacers 152, and above a top surface of the metal cap 110 (not covered by the dielectric underlayer 120). Thus, in this embodiment, remaining top and bottom portions of the second metal layer 220 and metal liner 210 provide a top electrode 224 and a bottom electrode 222 for the memory device 100, as shown in the figure.

As described above, recessing the dielectric underlayer 120 after patterning the MTJ pillar 12 and forming sidewall spacers 152 allows simultaneously forming the top electrode 224 and the bottom electrode 222 while preventing metal re-sputtering of underlying bottom metal layers onto sidewalls of the MTJ pillar 12.

Remaining portions of the second metal layer 220 forming the top electrode 224 and the bottom electrode 222 may have a thickness varying from approximately 2 nm to approximately 25 nm and ranges there between, although a thickness less than 2 nm and greater than 25 nm may be acceptable.

Accordingly, in this embodiment, the top electrode 224 includes the second metal layer 220 directly in contact with the metal liner 210. As can be observed in FIG. 2C, in the top electrode 224, the metal liner 210 is located at an interface between the second metal layer 220 and uppermost surfaces of the sidewall spacers 152 and MTJ pillar 12 (i.e., the upper surface of the MTJ pillar 12 not covered by the dielectric hardmask 140), at an interface between the second metal layer 220 and sidewalls of the dielectric hardmask 140, and at an interface between the second metal layer 220 and the top dielectric layer 142. It should be noted that the portion of the metal liner 210 located at the interface between the second metal layer 220 and the top dielectric layer 142 has a stepped shape that resembles the letter "L". Thus, the top electrode 224 includes a stepped or L-shaped top portion, as can be observed in FIGS. 2C-2G.

Additionally, in this embodiment, the bottom electrode 222 includes the second metal layer 220 directly in contact with the metal liner 210. As can be observed in FIG. 2C, in the bottom electrode 222, the metal liner 210 is located at an interface between the second metal layer 220 and an uppermost surface of the metal cap 110, at an interface between the second metal layer 220 and sidewalls of the dielectric underlayer 120, and at an interface between the second metal layer 220 and bottommost surfaces of the sidewall spacers 152 and MTJ pillar 12 (i.e., the bottom surface of the MTJ pillar 12 not covered by the dielectric underlayer 120).

Figure 2E:
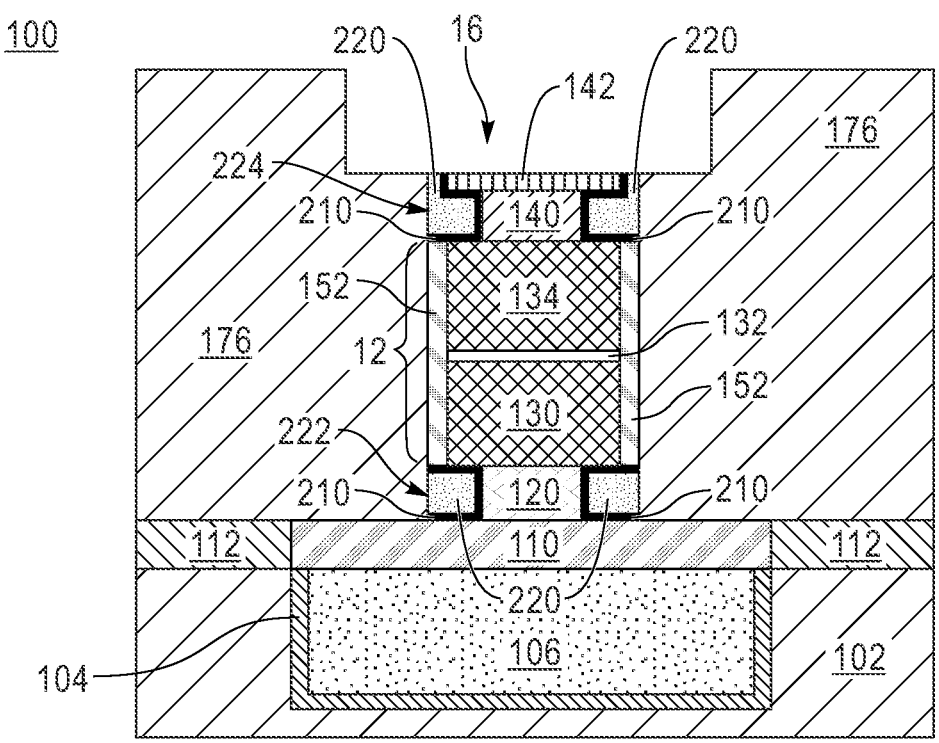
FIG. 2E is a cross-sectional view of the memory device after top contact patterning, according to an alternate embodiment of the present disclosure.
Figure 2F:
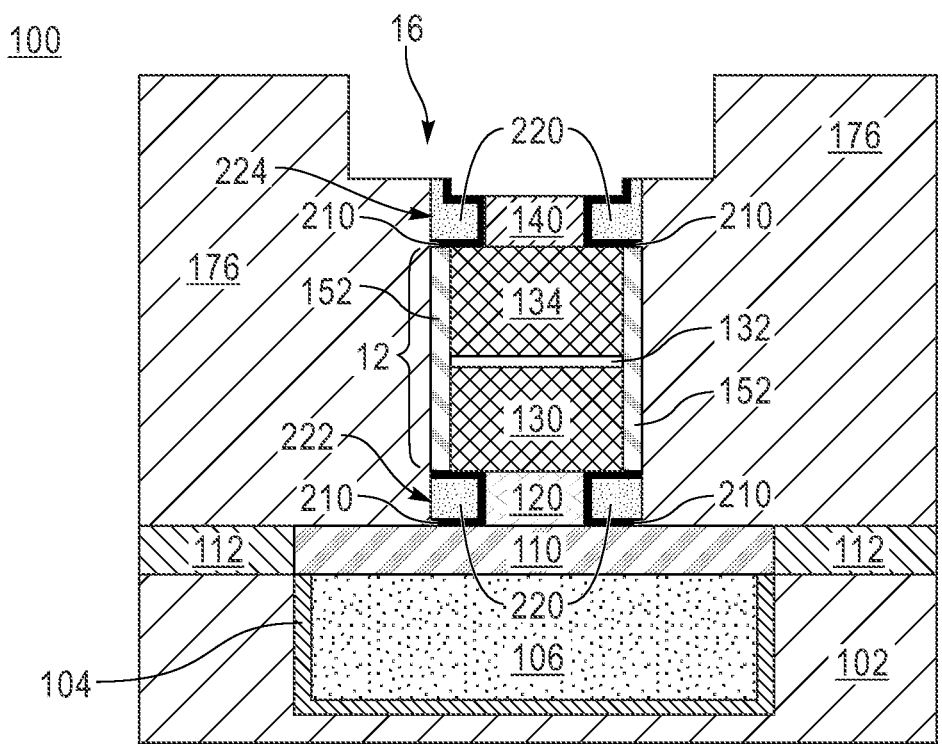
FIG. 2F is a cross-sectional view of the memory device after removing the top dielectric layer, according to an alternate embodiment of the present disclosure.
Figure 2G:
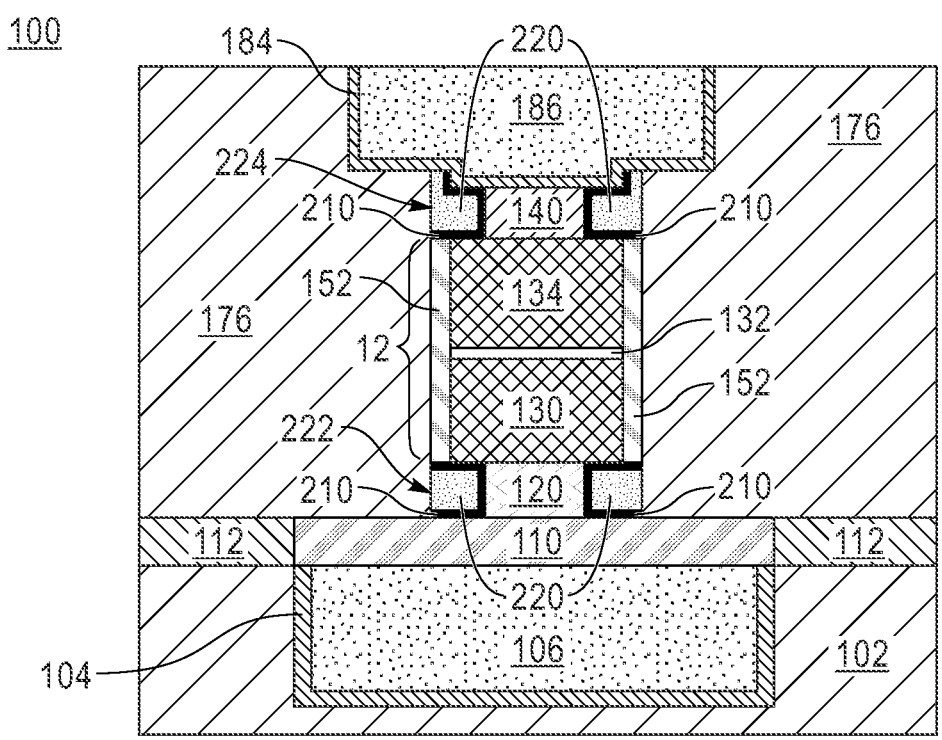
FIG. 2G is a cross-sectional view of the memory device after forming the second conductive structure, according to an alternate embodiment of the present disclosure.

After depositing and etching back the metal liner 210 and the second metal layer 220 (FIG. 2B) for forming the top and bottom electrodes 222 and 224, the process continues by depositing the fourth dielectric layer 176 (FIG. 2D) and forming the second conductive structure 186 (FIGS. 2E-2G). It should be noted that the processing steps depicted in FIGS. 2D-2G are similar to the processing steps described above with reference to FIGS. 1P-1S. Thus, details of previously described features and techniques have been omitted to avoid unnecessarily obscuring the presented embodiments.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device, comprising:
a magnetic tunnel junction pillar surrounded by sidewall spacers, the magnetic tunnel junction pillar being located between a top electrode and a bottom electrode;
an amorphous dielectric hardmask in contact with a first portion of an uppermost surface of the magnetic tunnel junction pillar;
a first portion of a metal layer disposed on opposite sidewalls of the amorphous dielectric hardmask, the first portion of the metal layer being in contact with a second portion of the uppermost surface of the magnetic tunnel junction pillar extending outwards from the amorphous dielectric hardmask and an uppermost surface of the sidewall spacers, the first portion of the metal layer providing the top electrode;
a dielectric underlayer in contact with a first portion of a bottommost surface of the magnetic tunnel junction pillar; and
a second portion of the metal layer disposed on opposite sidewalls of the dielectric underlayer, the second portion of the metal layer being in contact with a second portion of the bottommost surface of the magnetic tunnel junction pillar extending outwards from the dielectric underlayer and a bottommost surface of the sidewall spacers, the second portion of the metal layer providing the bottom electrode.

2. The memory device of claim 1, wherein the second portion of the metal layer providing the top electrode comprises a stepped shape.

3. The memory device of claim 1, further comprising:
a first conductive structure within a first dielectric layer; and
a metal cap above the first conductive structure, the metal cap being located within a second dielectric layer disposed above the first dielectric layer, the bottom electrode being located above the metal cap.

4. The memory device of claim 3, wherein the bottom electrode further comprises:
a second portion of the metal liner directly in contact with the second portion of the metal layer, wherein the second portion of the metal liner is located at an interface between the second portion of the metal layer and an uppermost surface of the metal cap, at an interface between the second portion of the metal layer and sidewalls of the dielectric underlayer, and at an interface between the second portion of the metal layer and bottommost surfaces of the sidewall spacers and the magnetic tunnel junction pillar.

5. The memory device of claim 1, further comprising:
a second conductive structure above the top electrode, the second conductive structure being in contact with the amorphous dielectric hardmask and the first portion of the metal layer, the second conductive structure being located within a third dielectric layer.

6. The memory device of claim 4, wherein the top electrode further comprises:
a first portion of a metal liner directly in contact with the first portion of the metal layer, wherein the first portion of the metal liner is located at an interface between the first portion of the metal layer and uppermost surfaces of the sidewall spacers and the magnetic tunnel junction pillar, at an interface between the first portion of the metal layer and sidewalls of the amorphous dielectric hardmask, and at an interface between the first portion of the metal layer and the second conductive structure.

7. The memory device of claim 6, wherein the metal liner comprises at least one of TaN and TiN.

8. The memory device of claim 1, wherein the first portion of the metal layer and the second portion of the metal layer comprise a layer of a conductive metal including at least one of Ta, TaN, Ti, TiN, Ru, RuN, RuTa, RuTaN, W, and WN.

9. The memory device of claim 1, wherein the amorphous dielectric hardmask comprises at least one of amorphous $Al_2O_3$, amorphous $TiO_2$, and amorphous $HfO_2$.

10. A method of forming a memory device, comprising:
forming a magnetic tunnel junction pillar surrounded by sidewall spacers, the magnetic tunnel junction pillar located between a top electrode and a bottom electrode;
forming an amorphous dielectric hardmask in contact with a first portion of an uppermost surface of the magnetic tunnel junction pillar;
forming a first portion of a metal layer on opposite sidewalls of the amorphous dielectric hardmask, the first portion of the metal layer being in contact with a second portion of the uppermost surface of the magnetic tunnel junction pillar extending outwards from the amorphous dielectric hardmask and in contact with an uppermost surface of the sidewall spacers, the first portion of the metal layer providing the top electrode;
forming a dielectric underlayer in contact with a first portion of a bottommost surface of the magnetic tunnel junction pillar; and forming a second portion of the metal layer on opposite sidewalls of the dielectric underlayer, the second portion of the metal layer being in contact with a second portion of the bottommost surface of the magnetic tunnel junction pillar extending outwards from the dielectric underlayer and in contact with a bottommost surface of the sidewall spacers, the second portion of the metal layer providing the bottom electrode.

11. The method of claim 10, wherein the second portion of the metal layer providing the top electrode comprises a stepped shape.

12. The method of claim 10, further comprising:
forming a first conductive structure within a first dielectric layer; and
forming a metal cap above the first conductive structure, the metal cap being located within a second dielectric layer disposed above the first dielectric layer, the bottom electrode being located above the metal cap.

13. The method of claim 12, wherein forming the magnetic tunnel junction pillar further comprises:
depositing the dielectric underlayer above the metal cap;
depositing a magnetic tunnel junction stack above the dielectric underlayer;
depositing the amorphous dielectric hardmask above the magnetic tunnel junction stack; and
depositing a top dielectric layer above the amorphous dielectric hardmask.

14. The method of claim 13, further comprising:
patterning the magnetic tunnel junction stack to form the magnetic tunnel junction pillar;
conformally depositing a spacer material above the magnetic tunnel junction pillar;
etching the spacer material to form the sidewall spacers;
forming a sacrificial dielectric layer above the dielectric underlayer and surrounding the magnetic tunnel junction pillar;
recessing the sacrificial dielectric layer to expose top portions of the amorphous dielectric hardmask and top dielectric layer;
removing the sidewall spacers from sidewalls of the amorphous dielectric hardmask and the top dielectric layer; and
recessing the top dielectric layer.

15. The method of claim 14, further comprising:
laterally recessing the amorphous dielectric hardmask;
removing the sacrificial dielectric layer;
conformally Depositing the metal layer; and
etching back the metal layer such that the first portion of the metal layer provides the top electrode and the second portion of the metal layer provides the bottom electrode.

16. The method of claim 12, wherein the bottom electrode further comprises:
forming a second portion of the metal liner directly in contact with the second portion of the metal layer, wherein the second portion of the metal liner is located at an interface between the second portion of the metal layer and an uppermost surface of the metal cap, at an interface between the second portion of the metal layer and sidewalls of the dielectric underlayer, and at an interface between the second portion of the metal layer and bottommost surfaces of the sidewall spacers and the magnetic tunnel junction pillar, wherein the metal liner comprises at least one of TaN and TiN.

17. The method of claim 10, further comprising:
forming a second conductive structure above the top electrode, the second conductive structure being in contact with the amorphous dielectric hardmask and the first portion of the metal layer, the second conductive structure being located within a third dielectric layer.

18. The method of claim 17, further comprising:
forming a first portion of a metal liner directly in contact with the first portion of the metal layer, wherein the first portion of the metal liner is located at an interface between the first portion of the metal layer and uppermost surfaces of the sidewall spacers and the magnetic tunnel junction pillar, at an interface between the first portion of the metal layer and sidewalls of the amorphous dielectric hardmask, and at an interface between the first portion of the metal layer and the second conductive structure.

19. The method of claim 10, wherein the first portion of the metal layer and the second portion of the metal layer comprise a layer of a conductive metal including at least one of Ta, TaN, Ti, TiN, Ru, RuN, RuTa, RuTaN, W, and WN.

20. The method of claim 10, wherein the amorphous dielectric hardmask comprises at least one of amorphous $Al_2O_3$, amorphous $TiO_2$, and amorphous $HfO_2$.

* * * * *